United States Patent [19]
Arase

[11] Patent Number: 5,650,962
[45] Date of Patent: Jul. 22, 1997

[54] SEMICONDUCTOR NONVOLATILE MEMORY DEVICE

[75] Inventor: Kenshiro Arase, Kanagawa, Japan

[73] Assignee: Sony Corporation, Japan

[21] Appl. No.: 586,243

[22] Filed: Jan. 16, 1996

[30] Foreign Application Priority Data

Jan. 23, 1995 [JP] Japan .................................. 7-008489

[51] Int. Cl.$^6$ .................................................. G11C 11/34
[52] U.S. Cl. .............................. 365/185.18; 365/185.24; 365/185.26; 365/185.3; 365/185.33
[58] Field of Search ....................... 365/185.18, 185.24, 365/185.26, 185.29, 185.3, 185.33, 218

[56] References Cited

U.S. PATENT DOCUMENTS 5,444,664  8/1995  Kuroda et al. .................... 365/185.29

*Primary Examiner*—David C. Nelms
*Assistant Examiner*—Trong Quang Phan
*Attorney, Agent, or Firm*—Ronald P. Kananen

[57] ABSTRACT

A semiconductor nonvolatile memory device which is able to be repeatedly rewritten a certain number of times by electrically erasing its memory cells, the semiconductor nonvolatile memory device being comprised of a detecting circuit for detecting if there are any memory cells which had been over-erased (mal-erased) at each rewrite operation, a write circuit for writing, into any cell where over-erasure had been detected, data of a normal or inverted level based on the data which should be written in the over-erased cells, and a recorder for recording if the write circuit wrote the data the same or inverted in level.

10 Claims, 16 Drawing Sheets

FIG. 4

| | WORD LINE WL | BIT LINE BL | SOURCE LINE SRL |
|---|---|---|---|
| ERASE | 0V | FLOATING | 12V |
| WRITE | SELECT 12V UNSELECT 0V | [0] DATA 0V [1] DATA 7V | 0V |
| READ | SELECT 5V UNSELECT 0V | SELECT 2V | 0V |

FIG. 10

|  | NORMAL MEMORY CELL (DATA 1) | NORMAL MEMORY CELL (DATA 0) | LEVEL RECORDING MEMORY CELL |
|---|---|---|---|
| LEVEL (NORMAL) | $V_{th} > 5V$ | $V_{th} \simeq 1.5V$ | $V_{th} > 5V$ |
| LEVEL (INVERTED) | $V_{th} \simeq 1.5V$ | $V_{th} > 5V$ | $V_{th} \simeq 1.5V$ |

FIG. 11

| NORMAL MEMORY CELL | LEVEL RECORDING MEMORY CELL | DATA I/O DETERMINATION |
|---|---|---|
| $Vth > 5V$ | $Vth > 5V$ | DATA 1 |
| $Vth \simeq 1.5V$ | $Vth > 5V$ | DATA 0 |
| $Vth > 5V$ | $Vth \simeq 1.5V$ | DATA 0 |
| $Vth \simeq 1.5V$ | $Vth \simeq 1.5V$ | DATA 1 |

SEMICONDUCTOR NONVOLATILE MEMORY DEVICE

BACKGROUND OF THE INVENTION

1. Field of the Invention

The present invention relates to an electrically rewritable nonvolatile memory, for example, a flash EEPROM or other semiconductor nonvolatile memory device.

2. Description of the Related Art

As one type of electrically rewritable nonvolatile memory, there is known for example a NOR type flash memory. This NOR type flash memory writes data by using the channel hot electron (CHE) effect to inject electrons into a floating gate and erases data by using Fowler-Nordheim (FN) tunneling to pull the electrons from the floating gate to the source.

However, a NOR type flash memory has the problem of "over-erasing" in an erase operation. For example, when erasing all of the memory cells at one time, the erasing pulses continue to be supplied until erasing all of the memory cells while repeating a read operation for verifying the erasure. However, the erasure characteristics of the memory cells differ due to manufacturing variations etc. If the erasing pulses continue to be supplied until the memory cells which are the slowest in erasing have finished being erased, the memory cells which are the fastest in erasing will be over-erased. In certain circumstances, there is a possibility that the threshold voltage Vth of those memory cells will be depleted.

SUMMARY OF THE INVENTION

An object of the present invention is to provide a reliable flash memory which can be rewritten repeatedly, which can store data correctly even if there had been errors in erasure of cell at the time of rewriting, and which can avoid the occurrence of errors in erasure of cells.

To achieve the above object, the present invention provides a semiconductor nonvolatile memory device which is able to be repeatedly rewritten a certain number of times by electrically erasing its memory cells, the semiconductor nonvolatile memory device being comprised of a detecting circuit for detecting if there are any memory cells which had been over-erased (mal-erased) at each rewrite operation, a write circuit for writing, into any cell where over-erasure had been detected, data of a normal or inverted level based on the data which should be written in the over-erased cells, and a recorder for recording if the write circuit wrote the data the same or inverted in level.

The semiconductor nonvolatile memory device of the present invention preferably is one which writes data by injecting electrons into a floating gate by the channel hot electron (CHE) effect and erases data by pulling electrons from the floating gate by Fowler-Nordheim (FN) tunneling, wherein the write circuit writes data maintaining the same level at the time of the write operation when the data which should be written in the memory cells are all written state data and writes data inverted in level at the time of the write operation when the data which should be written in the memory cells are all erased state data.

The semiconductor nonvolatile memory device of the present invention preferably further comprises a read circuit supplying a voltage which is lower than the voltage supplied to the source and drain to a control gate which controls the floating gate.

The write circuit preferably tries an erase operation again when there are a plurality of the over-erased cells and the data to be written to these over-erased cells are different.

The semiconductor nonvolatile memory device of the present invention preferably further comprises a determination circuit for reading data from a memory cell of a designated address, reading the level data at the time of the write operation to the memory cell recorded in the level recorder, and determining the read data based on that level data and the read circuit maintains or inverts the level of the read data on the basis of the determination of the determination circuit.

Preferably, the level recorder is provided inside a memory portion in a memory array area.

Preferably, a level recorder is provided for each word line sector and writing is performed designating the level at the time of writing the data for each word line sector.

Preferably, the level recorder comprises at least one auxiliary bit line and an auxiliary memory cell connected to the auxiliary bit line corresponding to each word line sector.

Alternatively, the level recorder is provided for each block of a memory array area divided into blocks and writing is performed designating the level at the time of writing the data for each block.

According to the present invention, the existence of an over-erased cell is detected by an over-erased cell detecting circuit at each rewrite operation. When there are one or more over-erased cells, the write circuit writes data of a normal or inverted level at the time of the write operation based on the data which should be written in the over-erased cell. The level data recorder records whether the write circuit wrote the data at the same or inverted level. This enables the problem of over-erased cells to be circumvented.

The case where there are a plurality of the over-erased cells and the data which should be written to the over-erased cells differ can be handled by repeating the erase operation.

BRIEF DESCRIPTION OF THE DRAWINGS

These and other objects and features of the present invention will be clear from the following description of the preferred embodiments made with reference to the attached drawings, in which:

FIG. 4 is a table showing the conditions of each operation of the NOR type flash memory;

FIG. 10 is a table showing the relationship among the threshold voltage Vth of a normal memory cell and a level recording memory cell and the level of the write data;

FIG. 11 is a table showing the relationship among the threshold voltage Vth of normal memory cell and a level recording memory cell and the data determination in the normal memory cell;

DESCRIPTION OF THE PREFERRED EMBODIMENTS

Before explaining the preferred embodiments, the related art will be described in further detail in accordance with the drawings for reference purposes.

Figure 1:
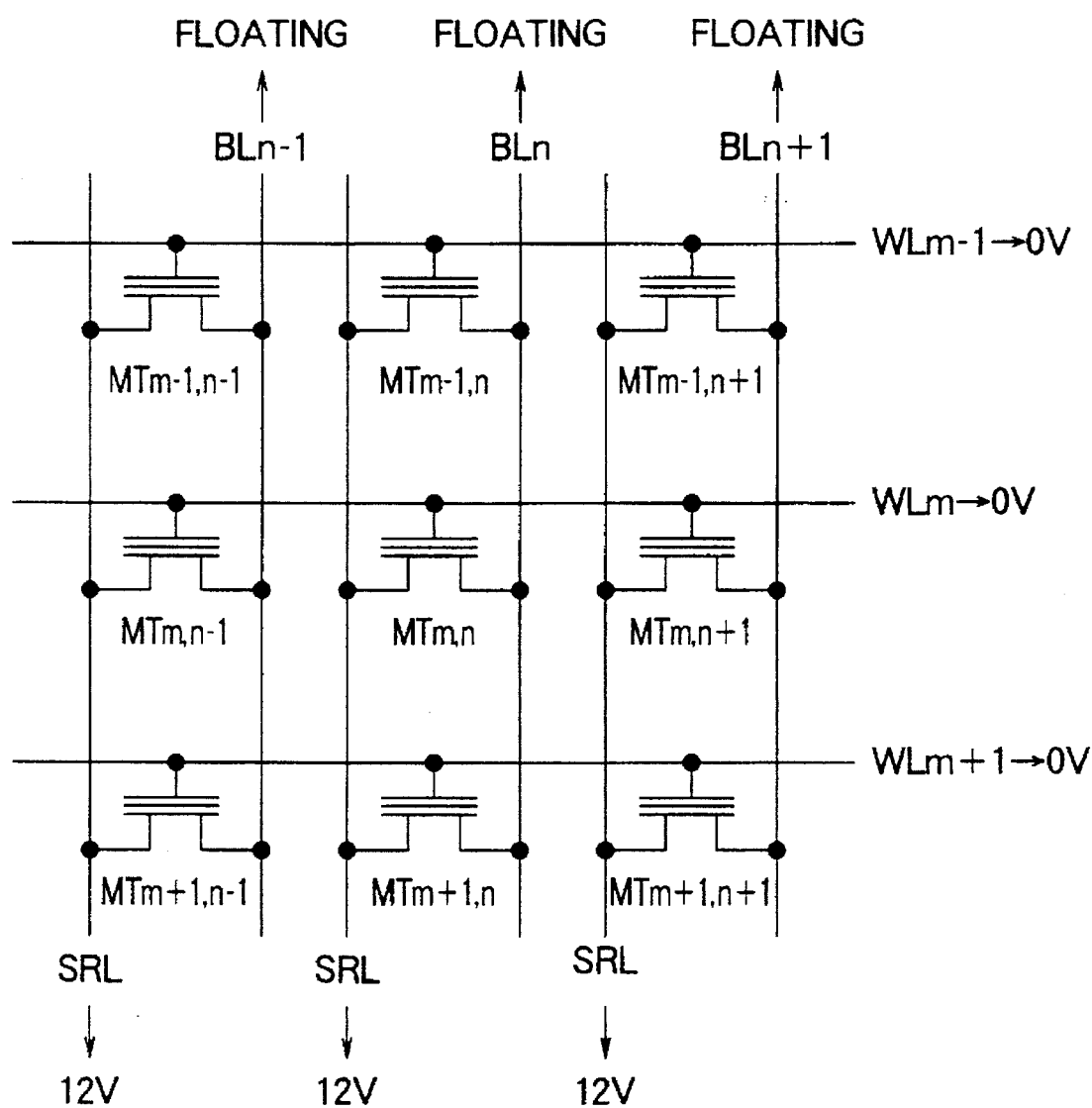
FIG. 1 is a diagram which shows the bias conditions at an erase operation in the NOR type flash memory.
Figure 2:
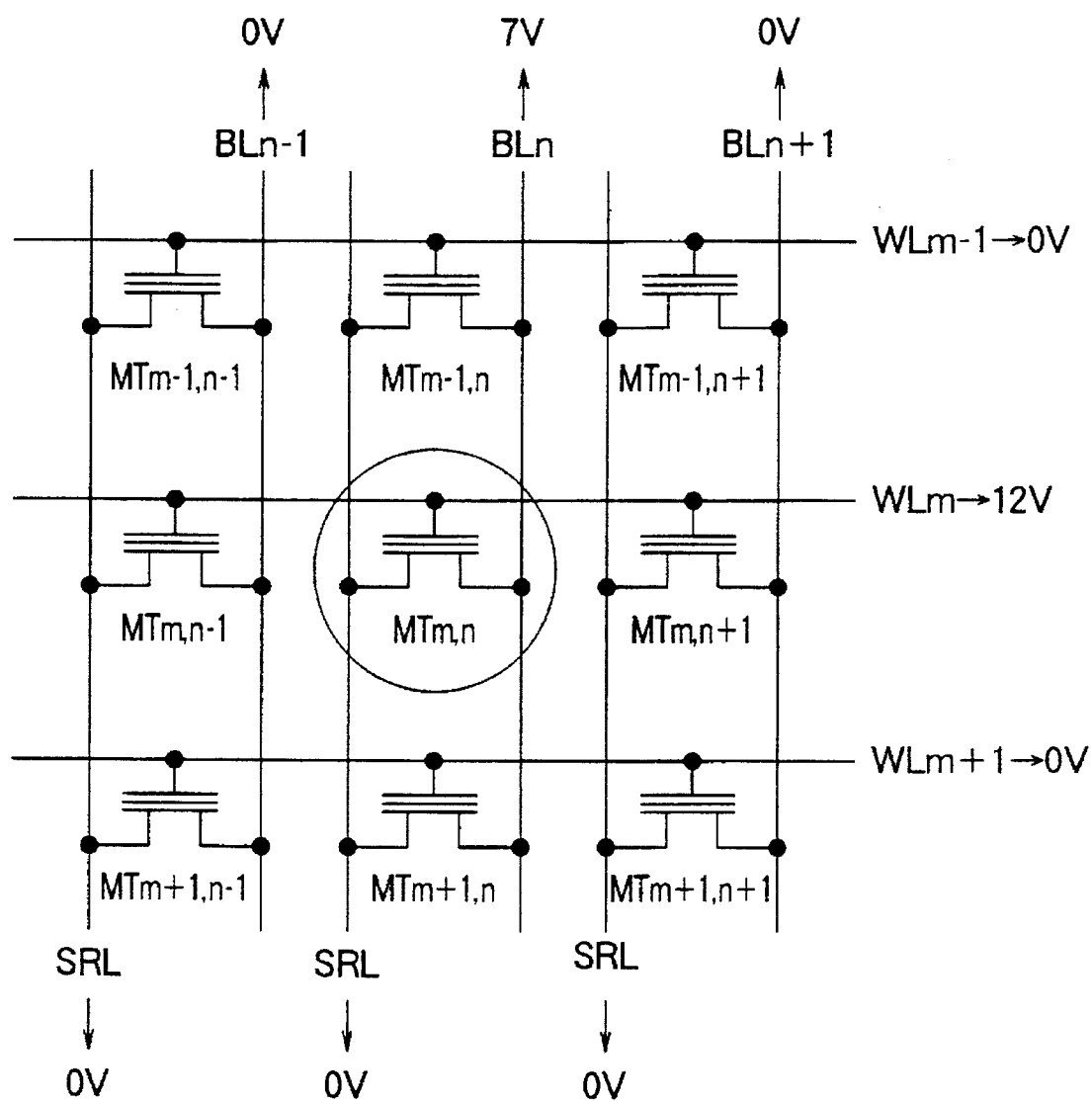
FIG. 2 is a diagram which shows the bias conditions at a write operation in the NOR type flash memory.
Figure 3:
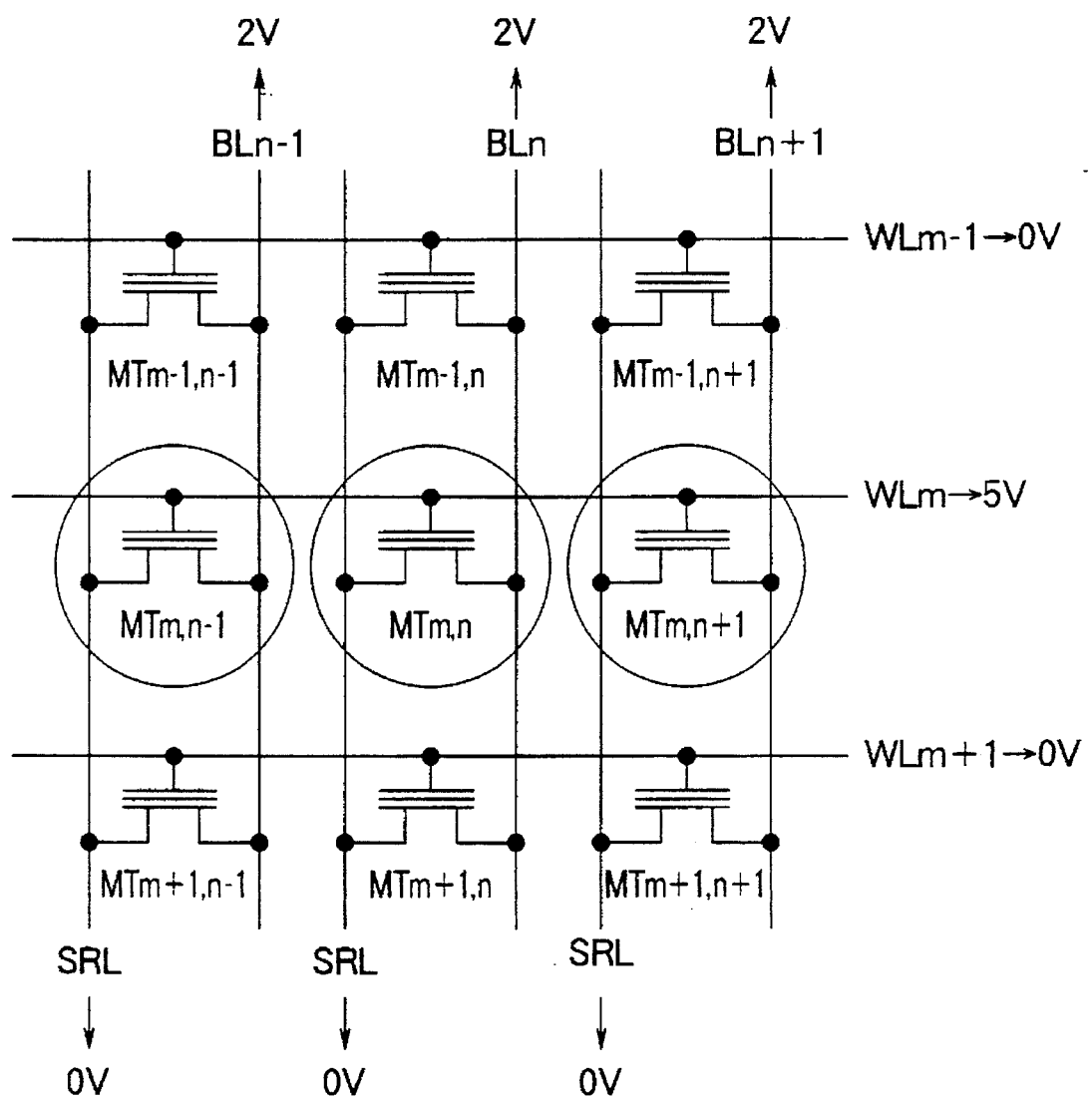
FIG. 3 is a diagram which shows the bias conditions at a read operation in the NOR type flash memory.

FIG. 1, FIG. 2, and FIG. 3 are views showing the bias conditions in a bulk erase operation, a 1-cell write operation, and a read operation of a NOR type flash memory, respectively. Each operation will be explained with reference to these figures.

In FIG. 1, FIG. 2, and FIG. 3, WLm-1, WLm, and WLm+1 show word lines, BLn-1, BLn, and BLn+1 show bit lines, SRL shows a common source line, and MTm-1, n-1, MTm-1,n, MTm-1, n+1, MTm, n-1, MTm, n, MTm, n+1, MTm+1,n-1, MTm+1,n, and MTm+1,n+1 show memory cells.

FIG. 1 is a view showing an example of the bias at erasing. Specifically, FIG. 1 is a view showing an example of the bias in the case of erasing all of the memory cells at one time in which electrons are pulled from the floating gate by Fowler-Nordheim tunneling to reduce the Vth of all the memory cells to a value between 1 and 2 volts.

In this case, 0 V is supplied to all of the word lines WLm-1, WLm, and WLm+1, all of the bit lines BLn-1, BLn, BLn+1 are biased to a floating condition, and 12 V is supplied to the common source line SRL.

As a result, the electrons in the floating gate are removed from the source side by FN tunneling and the threshold voltage Vth of all of the memory cells becomes about 1 to 2 V this value of Vth representative of a normally erased memory cell.

FIG. 2 is a view showing an example of the bias in the case of writing data to a single (circled) memory cell MTm,n in which electrons are injected into the floating gate to increase the Vth to a value greater than 5 volts.

In this case, the selected word line WLm is supplied with 12 V, the selected bit line BLn is supplied with 7 V, and the other word lines WLm-1 and WLm+1, bit lines BLn-1 and BLn+1, and the common source line SRL are supplied with 0 V.

As a result, the electrons are injected into the floating gate of only the single selected memory cell MTm,n by the channel hot electron (CHE) effect, and the threshold voltage Vth becomes not less than 5 V, this value of Vth representative of a written to (data 1) memory cell.

FIG. 3 is a view showing an example of the bias in the case of reading data from the three circled memory cells MTm,n-1, MTm,n, and MTm,n+1 which are connected to the selected word line WLm.

In this case the selected word line WLm is supplied with 5 V, all of the bit lines BLn-1, BLn, and BLn+1 are supplied with 2 V, and the other word lines WLm-1 and WLm+1 and the common source line SRL are supplied with 0 V.

As a result, among the memory cells which are connected to the selected word line WLm, those memory cells which are in the "off" condition, i.e., non-conducting at the applied 5-volt word line bias, are determined to indicate the data "1" (written condition) and those memory cells which are in the "on" condition, i.e., conducting at the applied 5-volt word line bias, are determined to indicate the data "0" (erased condition).

FIG. 4 is a table showing the bias conditions of the bulk erase operation, write operation, and read operation of the above-explained NOR type flash memory.

As mentioned earlier, the above explained NOR type flash memory has the problem of "over-erasing" some of the memory cells during an erase operation resulting in a Vth that is unacceptably low for the over-erased cells.

For example, when bulk erasing all of the memory cells of FIG. 1 at one time, the erasing pulses continue to be supplied until erasure all of the memory cells is achieved while repeatedly performing a read operation to verify the erasure, i.e., verify that the Vth of all the memory cells is below a predetermined value.

However, when the erasure characteristics of the memory cells differ due to manufacturing variations etc., if the erasing pulses continued to be supplied until the memory cell which is the slowest in erasing has finished being erased, the memory cell which is the fastest in erasing will be over-erased. In certain circumstances, there is a possibility that the threshold voltage Vth of the faster memory cells will be depleted.

Figure 5:
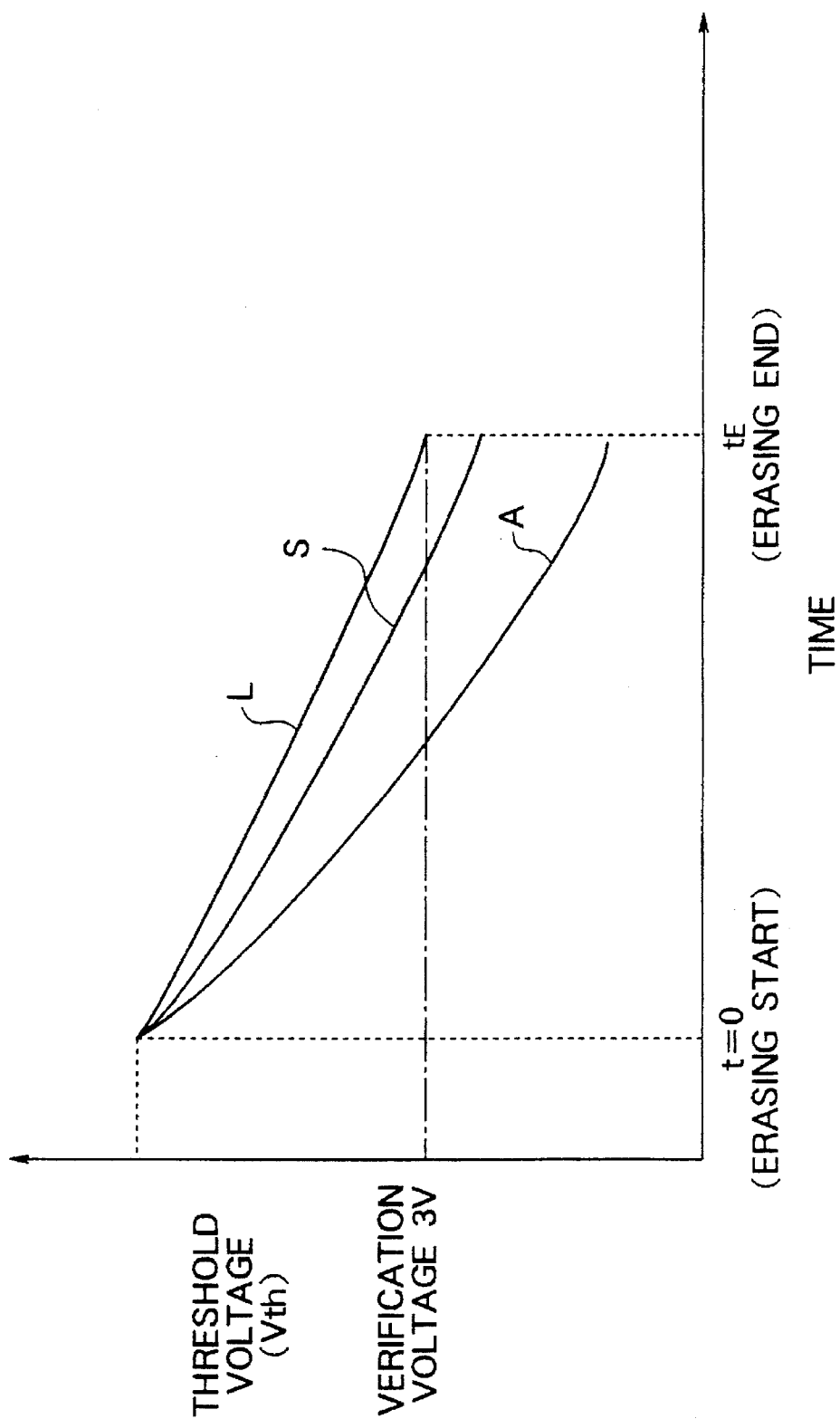
FIG. 5 is a graph explaining the specific characteristic of over-erasing in a NOR type flash memory.

FIG. 5 is a graph for explaining this over-erasing problem.

In FIG. 5, the abscissa shows the erasing time, and the ordinate shows the threshold voltage Vth. The curve L in the graph shows the characteristic of the memory cell which is the slowest in erasing. The curve S shows the characteristic of the memory cell which is standard in erasing. The curve A shows the characteristic of the memory cell which is the fastest in which memory cells are most susceptible to possible over-erasure.

As shown in FIG. 5, all of the memory cells continue to be supplied with the erasing pulses until the threshold voltage Vth of the memory cell which is the slowest in erasing becomes less than the verification voltage, for example, not more than 3 V in this example.

As a result, the faster memory cell caused by manufacturing variations etc. continues to be erased even after its threshold voltage Vth becomes less than the verification voltage as expressed by the curved "A" in FIG. 5. Therefore, the threshold voltage Vth of the memory cell which is the fastest in erasing becomes depleted.

If an over-erasing cell has occurred at an erase operation and that erased cell was supposed to be given the "0" data (erased condition) when rewriting the data, when the read operation described in FIG. 3 is performed, the current flows through the memory cell (over-erased cell) which is connected to an unselected word line and it becomes impossible to determine correctly the data of the memory cell which is located on the selected word line.

Preferred embodiments of the present invention will now be explained in detail with reference to the drawings.

Figure 6:
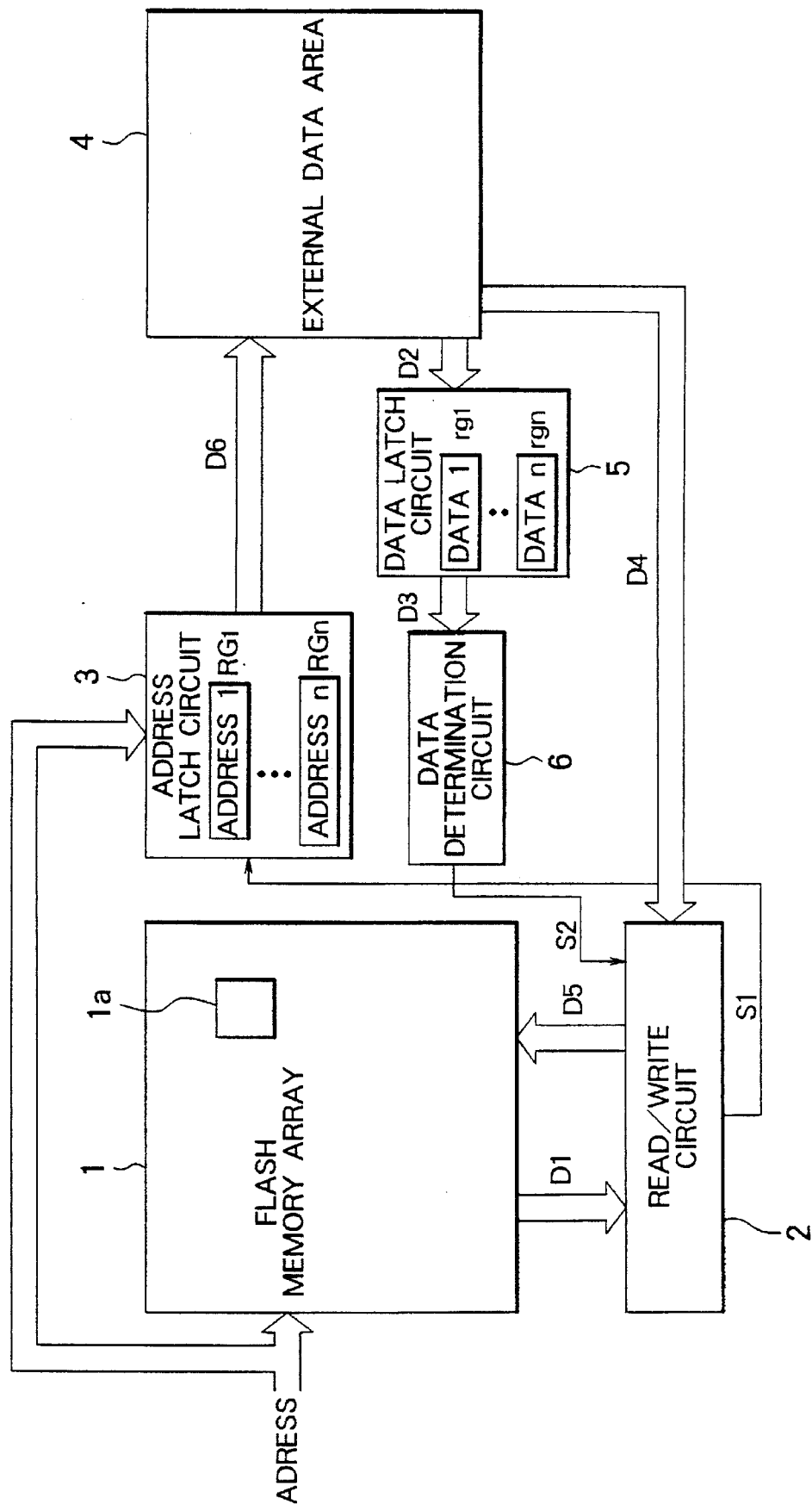
FIG. 6 is a circuit diagram of a semiconductor memory device according to a first embodiment of the present invention.

FIG. 6 is a block diagram of a nonvolatile semiconductor memory device according to an embodiment of the present invention. Specifically, FIG. 6 is a block diagram of the embodiment which is concerned with a NOR type flash memory which perform CHE writing/FN erasing.

As shown in FIG. 6, this nonvolatile semiconductor memory device is comprised of a flash memory array 1, a level data recorder 1a which is located in the flash memory array 1, a read/write circuit 2 of the flash memory array 1 which includes a sense amplifier, an address latch circuit 3, an external data area 4, a data latch circuit 5, and a data determination circuit 6. As explained below, the level data recorder 1a is basically a 1-bit "flag" that indicates whether the data written into a portion of the memory array 1 has been inverted or not.

The address latch circuit 3 has latches RG1 to RNA for temporarily storing the address of a memory cell in the flash memory array 1 which is over-erased (mal-erased).

The external data area 4 stores the data to be rewritten to the flash memory array 1 and is composed of a semiconductor memory such as a DRAM or SIAM, a magnetic tape, a magnetic disc, an optical disc, etc.

The data latch circuit 5 has latches rg1 to rgn for reading rewrite data from the external data area 4 and storing the rewrite data temporarily until the rewrite data is written at the address of the memory cell of the flash memory in which over-erasing had occurred and which is stored in address latch circuit 3.

The data determination circuit 6 determines, according to the data which should be written in the memory cell in which the over-erasing occurred and stored in the data latch circuit 5, whether, when rewriting data in the over-erased memory cell in the flash memory array 1, tow rite data having the same level as the intended data, (i.e., leave the level as it is), write data having an inverted level from the intended data, or repeat the erase operation again.

In the figure, D1 to D6 show the flows of data, and S1 and S2 show the flows of the control signals.

Figure 7:
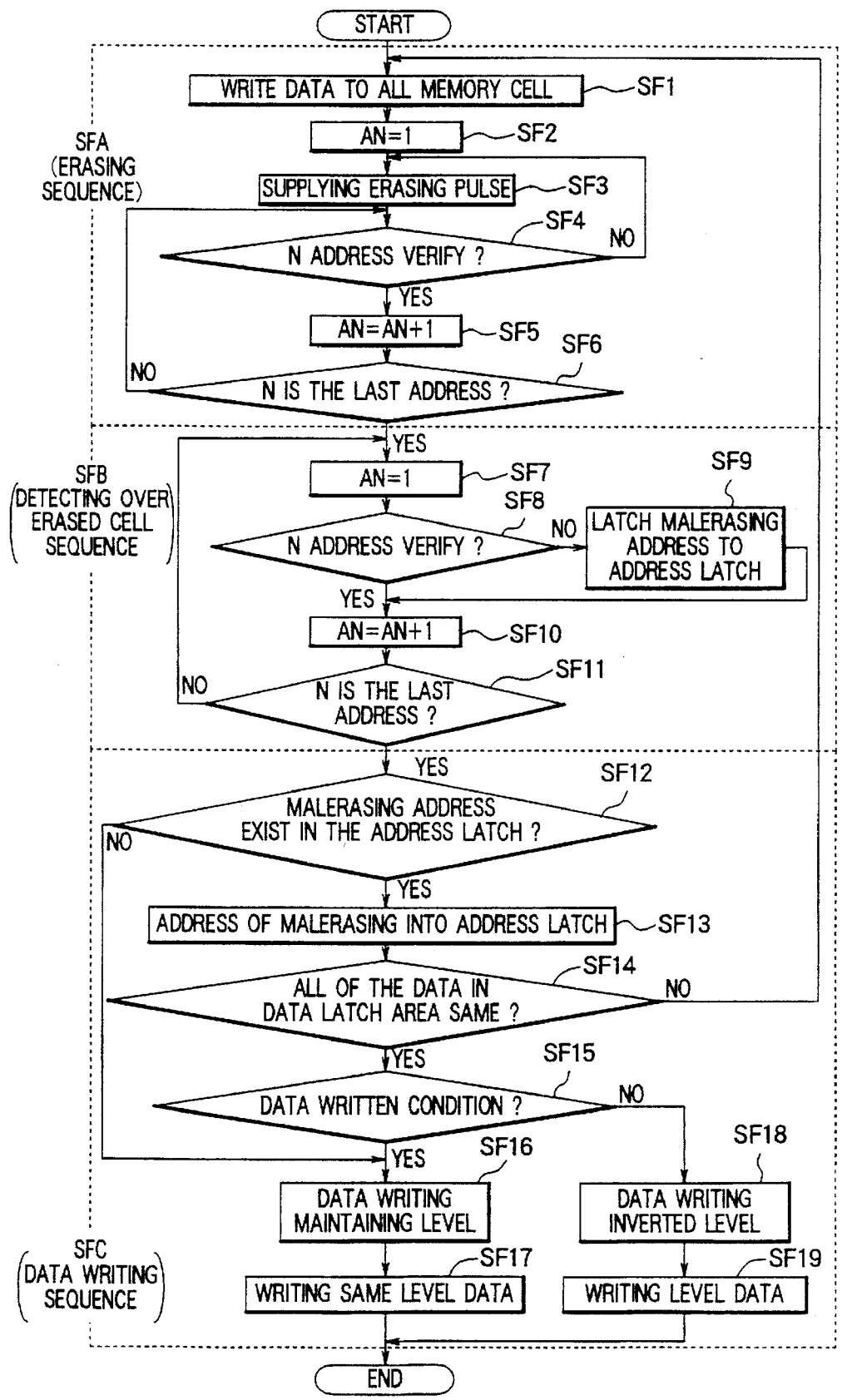
FIG. 7 is a flow chart which shows the sequence of steps in a rewrite operation of a NOR type flash memory according to the present invention.

FIG. 7 is a flow chart of the rewrite sequence for each rewrite operation for the NOR type flash memory in FIG. 6.

The rewrite sequence shown in FIG. 7 is carried out by performing the three basic sequences SFA, SFB, and SFC continuously.

SFA is an erase sequence which performs the normal bulk erase operation and consists of the steps SF1 to SF6.

SFB is a detect sequence which detects the address of a memory cell over-erased by an erase operation of the erase sequence SFA and consists of the steps SF7 to SF11.

SFC is a sequence which determines the level of the data and writes it on the basis of the data which should have been written in the over-erased cell detected in the sequence SFB and consists of the steps SF12 to SF19.

Next, the rewrite operation of the NOR type flash memory according to the present invention will be explained with reference to the block diagram shown in FIG. 6 and the sequences shown in FIG. 7.

The erase operation sequence SFA is exactly the same as that of a prior art NOR type flash memory.

That is to say, prior the erase operation, data is written to all of the memory cells of the flash memory array 1 (SF1). This is to reduce the variation in the threshold voltage Vth of the memory cells.

Next, "1" is set for the memory cell address no. "AN" in the flash memory array (SF2).

Next, the erasing pulses are supplied to the flash memory array 1 to erase all the memory cells at one time (SF3).

Following the sequence SF3, a read operation is performed for verification of the state of the memory cell of the address no. "AN" (SF4). If the erasing was incomplete, erasing pulses are supplied again. If the erasing was completed, the memory cell address no. "AN" is incremented by "1" (SF5). This incrementation is continued until all of the memory cell address nos. "AN" have been finished (SF6).

As a result, the threshold voltage Vth of all the memory cells in the flash memory array 1 will be not more than the verification read voltage (i.e., 3-volts) of step SF4, and the erase operation will be finished.

Figure 8:
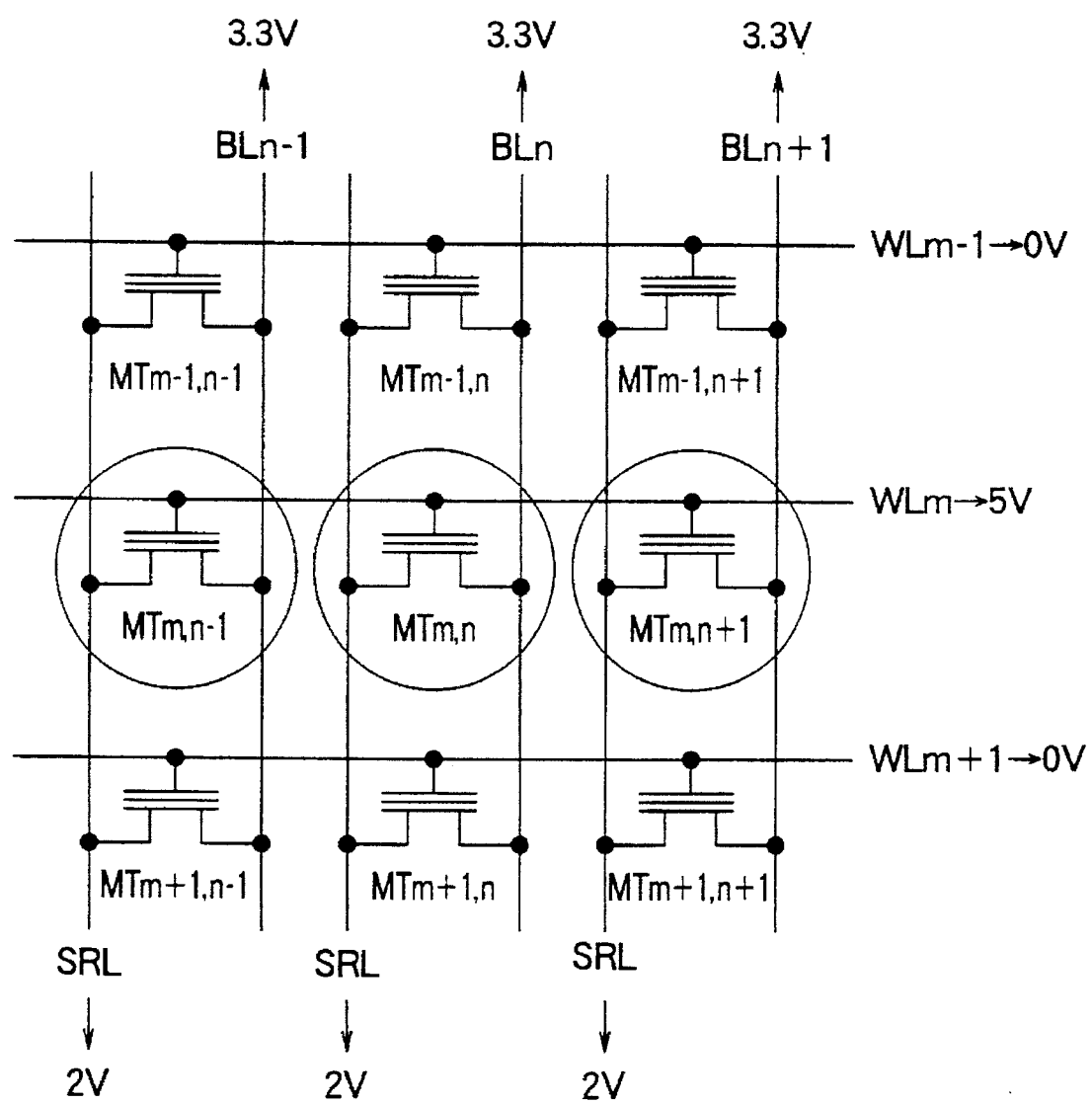
FIG. 8 is a diagram which shows the bias conditions at a read operation of data for checking whether the erasure had been completed or not in the sequence of FIG. 7.

As described in "1994 Symposium on VLSI Circuit, pp. 63–64", the verification read operation in step SF4 is realized by supplying the bias voltage shown FIG. 8.

The example of the read operation shown in FIG. 8 is the case of reading the data from the circled memory cells MTm,n−1, MTm,n, and MTm,n+1 in the figure which are connected to the selected word line WLm. In this case, the selected word line WLm is supplied with 5 V, all of the bit lines BLn−1, BLn, and BLn+1 are supplied with 3.3 V, the other word lines WLm−1 and WLm+1 are supplied with 0 V, and the common source line SRL is supplied with 2 V.

The verification read voltage becomes substantially 3 V by supplying 5 V to the selected word line WLm and applying 2 V to the common source line SRL.

By supplying 2 V to the common source SRL, even if there are over-erased cells among the memory cells which are connected to the unselected word lines WLm and WLm+1, the read operation from the memory cell of the selected word line WLm is not adversely influenced.

As a result, among the memory cells MTm, n−1, MTm, n, and MTm,n+1 which are connected to the selected word line WLm, a memory cell which is in the "off" condition will be determined as a cell which has not finished being erased and a memory cell which is in the "on" condition will be determined as a cell which has finished being erased. The detection of any memory cell in the "off" condition on any selected word line WL cause additional erase pulses to be applied until all memory cells are in their "on" state, thus indicating that all memory cells are either erased or over-erased.

Following this, the over-erasing detecting sequence SFB detects an address of a memory cell over-erased by the erase operation of the sequence SFA.

First, "1" is set for the memory cell address no. "AN" of the flash memory array 1 (SF7).

Next, an over-erase verification read operation (FIG. 9) is performed on the memory cell with the address no. "AN" to verify the existence of an over-erased cell (SF8). If there is an over-erased cell, the address latch circuit 3 stores the memory cell address no. "AN" temporarily (SF9) and increments the address no. "AN" by "1" (SF10). If there is no over-erased cell, the address latch circuit 3 increments the address no. "AN" by "1" without storing it. The above operation is repeated until all of the memory cell address nos. "AN" are finished (SF11).

As a result, in the flash memory array 1, the addresses of the memory cells in which the threshold voltage Vth is not more than the verification read voltage of step SF8 (about 0.5 volts, as explained below) will be stored in the address latch circuit 3 temporarily.

Figure 9:
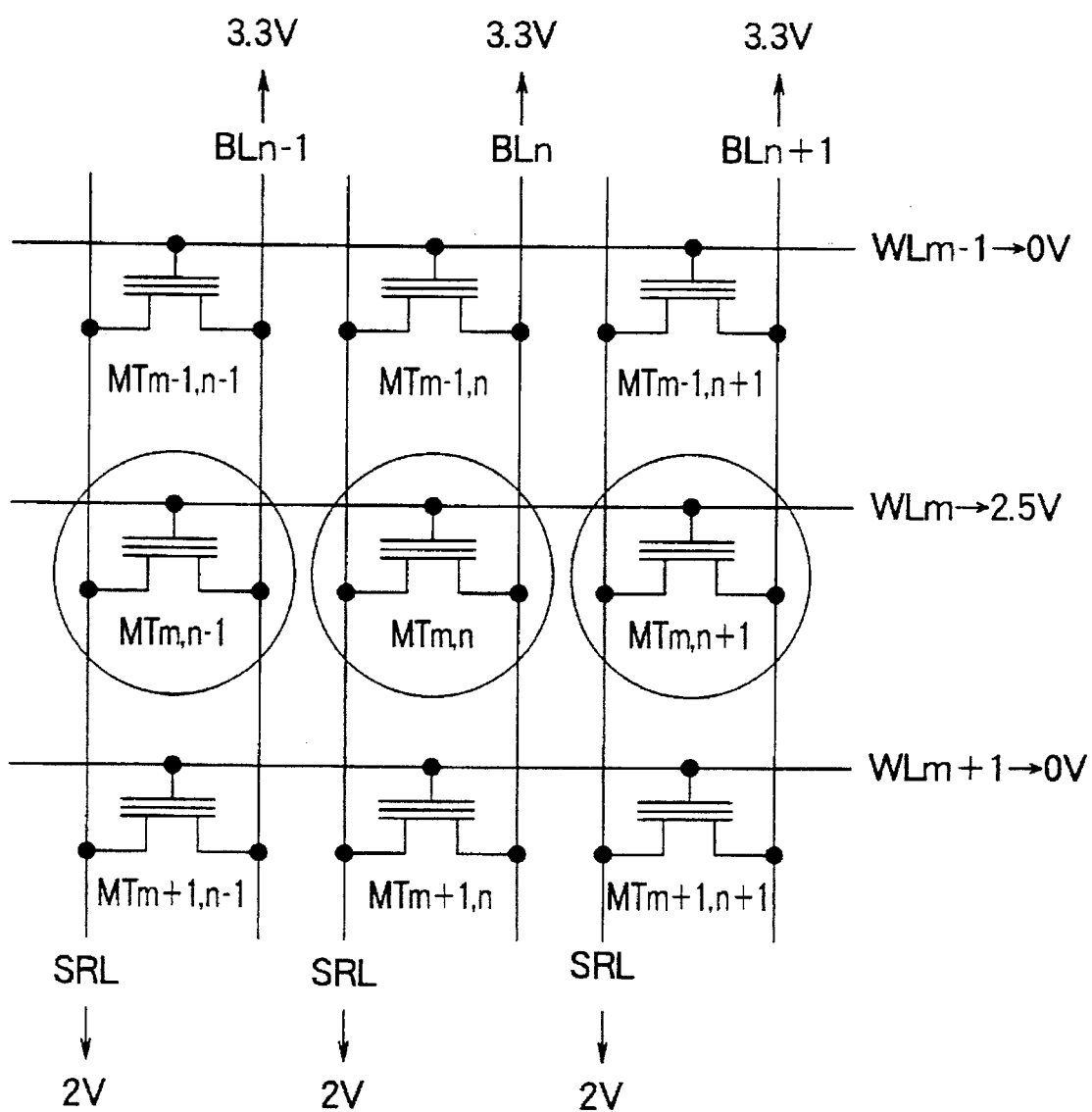
FIG. 9 is a diagram which shows the bias conditions at a read operation of data for checking whether there are over-erased cells in the sequence of FIG. 7.

As described in "1994 Symposium on VLSI Circuit, 63–64", the verification read operation in step SF8 is realized by supplying the bias voltage shown FIG. 9.

The example of the over-erase verification read operation shown in FIG. 9 is the case of reading by page unit the data of the circled memory cells MTm,n–1, MTm,n, and MTm, n+1 which are connected to the selected word line WLm. In this case, the selected word line WLm is supplied with 2.5 V, all of the bit lines BLn–1, BLn, and BLn+1 are supplied with 3.3 V, the other word lines WLm and WLm+1 are supplied with 0 V, and the common source line SRL is supplied with 2 V.

By applying 2.5 V to the selected word line and applying 2 V to the common source line SRL, the verification read voltage becomes substantially 0.5 V. By applying 2 V to the common source line SRL, even if there is an over-erased memory cell among the memory cells of the unselected word lines WLm–1 and WLm+1, the read operation from the memory cells of the selected word line WLm is not adversely influenced.

As a result, among the memory cells MTm,n–1, MTm,n, and MTm, n+1 which are connected to the selected word line WLm and for which the verification read voltage is substantially 0.5 volts, a memory cell which is in the "off" condition will be determined as a normal erased cell and a memory cell which is the "on" condition will be determined as an over-erased cell.

At the completion of the sequence SFB of FIG. 7, all memory cells MT will be in either a normally erased condition or an over-erased condition with the addresses of the over-erased memory cells, if any, stored the latches RG1 . . . RGn of the address latch circuit 3 shown in FIG. 6.

Next, in the data write sequence SFC, the level of the data is determined and the flash memory array 1 is rewritten on the basis of the data which should have been written to the over-erased cell which was detected by the over-erased cell detecting operation of the sequence SFB.

First, it is determined if there is an address no. of a memory cell in which over-erasing has occurred in the latches RG1 to RGn in the address latch circuit 3 (SF12).

If there is no address no. of a memory cell in which over-erasing occurred, the program flow branches to step SF16 where the rewrite data which is stored in the outside data area 4 is read bit by bit and written at the prescribed area in the flash memory array 1 while maintaining the level of original data (SF16). Since there was no over-erased memory cells, there is no need to invert the data from the external data area 4 as it is written into the memory array. The level data is written in the level data recorder 1a (SF17).

If there is an address no. of a memory cell in which over-erasing occurred in the address latch circuit 3, the data which should be written in the memory cell in which the over-erasing occurred is read from the prescribed area in the external data area 4 and stored in the data latch circuit 5 (SF13).

Next, it is determined whether all of the bits of data which are stored in data latch circuit 5 and which should be written in the memory cells in which over-erasing had occurred are the same or not (SF14).

If there are a plurality of bits of data which are stored in the data latch circuit 5 and which should be written in the memory cells in which over-erasing had occurred and these bits of data are not the same, the erase operation of the flash memory array 1 is repeated.

Accordingly, the program flow branches from decision step SF14 back to the beginning of execution step SF1 and the entire sequence re-started.

If the bits of data which are stored in data latch circuit 5 and which should be written in the memory cells in which the over-erasing had occurred are the same and the data was the written condition (SF15), the rewrite data which is stored in the external data area 4 are read bit by bit.

Next, the bits of data are written at the prescribed areas in the flash memory array 1 while maintaining their level (SF16) and level data indicating the normal level is written in the level data recorder 1a (SF17).

In this embodiment, the data of the written condition is the one which is written to a normal memory cell by injecting electrons into the floating gate. On the other hand, the data of the erased condition is the one which is written to the normal memory cell by extracting electrons from the floating gate.

If all of the bits of data which are stored in the data latch circuit 5 and are to be written in the memory cells in which over-erasing has occurred are the same and are of the erased condition (SF15), the bits of rewrite data are read one by one from the outside data area 4. After that, the data are written to the prescribed areas of the flash memory array 1 inverted in level (SF18) and level data indicating level inversion is written in the level data recorder 1a (SF19).

As a result of the above operation, even if over-erasing has occurred in the flash memory array 1 during the erase sequence SFA, this can be detected in the over-erasing detection sequence SFB. In the data write sequence SFC, the level of the data which is written in the flash memory array 1 will be controlled on the basis of the data which should be written in the memory cells in which the over-erasing had occurred or the erase operation will be tried again.

As a result, even if there are over-erased memory cells, after the write operation is finished, all of the memory cells which are over-erased will be in the written condition. In other words, the threshold voltage Vth will be more than 5 V, and the disadvantage of over-erasing can be avoided.

FIG. 10 is a table which shows the relationship between the threshold voltages Vth of a normal memory cell in the flash memory array 1 and of a level recording memory cell of the level data recorder 1a and the level at the time of writing data to the memory array.

As shown in FIG. 10, when the level is normal, the level is the same as that of the NOR type flash memory of a normal CHE writing/FN erasing type, the data "1" is indicated by a threshold voltage Vth of more than 5 V, the data "0" is indicated by a threshold voltage Vth of about 1.5 V, and the threshold voltage Vth of the level recording memory cell is set to more than 5 V.

On the other hand, when the level of the written data has been inverted, the level is inverted from that of the NOR type flash memory of the normal CHE writing/FN erasing type, the data "1" is indicated by a threshold voltage Vth of about 1.5 V, the data "0" is indicated by a threshold voltage Vth of more than 5 V, and the threshold voltage Vth of the level recording memory cell is set to about 1.5 Volts thus indicating that the recorded bits have been inverted because of the presence of at least one over-erased memory cell.

When reading data of a normal memory cells in the flash memory array 1, the data is read from the memory cell indicated by the address and the level data of the time of writing to this memory cell which is stored in the level data recorder 1a is read and a determination made as to the read data based on this level data.

FIG. 11 is a table which shows the relationship between the threshold voltages Vth of a normal memory cell in the flash memory array 1 and of a level recording memory cell in the level data recorder 1a and the data determination in the normal memory cell.

In FIG. 11, the first and second rows represent the conditions for non-inverted data written to normal memory cells while the third and fourth rows represent the conditions for inverted data written to normal memory cells.

As shown in FIG. 11, in the case where the threshold voltage Vth of the normal memory cell is more than 5 V and the threshold voltage Vth of the level recording memory cell is set to more than 5 V, the level is normal and the data of the normal memory cell is determined as "1".

In the case where the threshold voltage Vth of the normal memory cell is about 1.5 V and the threshold voltage Vth of the level recording memory cell is set to more than 5 V, the level is inverted and the data of the normal memory cell is determined as "0".

In the case where the threshold voltage Vth of the normal memory cell is more than 5 V and the threshold voltage Vth of the level recording memory cell is set to about 1.5 V, the level is inverted and the data of the normal memory cell is determined as "0".

In the case where the threshold voltage Vth of the normal memory cell is about 1.5 V and the threshold voltage Vth of the level recording memory cell is set to about 1.5 V, the level is inverted and the data of the normal memory cell is determined as "1".

Figure 12A:
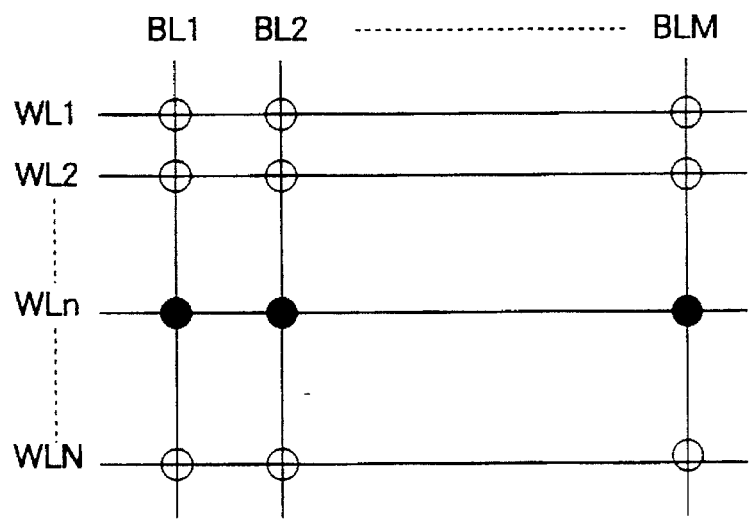
FIG. 12A is a diagram of a first example of a case in which the level data recorder is located in the flash memory array.
Figure 12B:
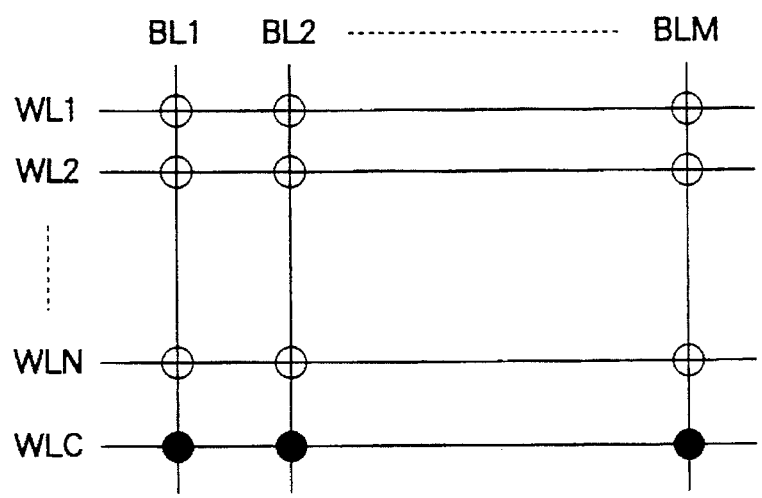
FIG. 12B is a diagram of a second example of the case in which the level data recorder is located in the flash memory array.

FIG. 12A and FIG. 12B are diagrams which show two examples of the case of positioning the level data recorder 1a in the flash memory array 1.

FIG. 12A is a diagram which shows the case where the level data recorder which is located in the memory array area is connected to one normal word line in the memory array.

In FIG. 12A, WL1 to WLN show normal word lines, BL1 to BLM show bit lines, and WLn shows one word line for the level data recorder which is located in the normal word lines. In FIG. 12A, the small white circles show the memory cells which are used as the normal memory cells, while the black circles shows the memory cells which are used as the level data recorders. It is enough that there will be only one memory cell (i.e., a 1-bit "flag") which is used as a level data recorder. Information of the file name, the date, the time of rewrite, etc. can be written in the other memory cells.

FIG. 12B is a diagram which shows the case where the level data recorder which is positioned in the memory array area is connected to an auxiliary word line provided in the memory array.

In FIG. 12B, WL1 to WLN shows normal word lines, BL1 to BLM show bit lines, and WLC shows the auxiliary word line for the level data recorder which is located outside of the normal word lines. Similar to the case of FIG. 12A, in FIG. 12B, the small white circles show the memory cells which are used as the normal memory cells and the black circles shows memory cells which are used as the level data recorders. It is enough that there will be only one memory cell which is used as the level data recorder. The information of the file name, the date, the time of rewrite, etc. may be written in the other memory cells.

While FIG. 12A and FIG. 12B showed two cases where the level data recorder was located in the memory array area, the invention is not limited to these examples and includes other modifications.

In the embodiments explained above, all of the memory cells in the memory array were erased at one time and the rewrite operation was performed with the determination of the level data at the time of the writing. In applying this invention, however, it is also possible to erase, determine level data, and rewrite data in units of a word line sector or a block of a memory array area divided into blocks.

By determining the level data at the time of rewrite for each word line sector or block of a divided memory array area, even if there are a large number of over-erased cells occurring in the memory array during the erase operation, only a small number of the over-erased cells will remain in each word line sector or block serving as the units of rewriting.

As a result, the probability that a plurality of the over-erased cells will exist in any one word line sector or block is low. Even in the rare case of a plurality of over-erased cells, the possibility that the data which should be written to the over-erased cells are not the same and the erase operation must be performed again by branching from decision step SF14 in FIG. 7 to execution step SF1 is small.

When rewriting data by designating the level data at the rewrite for each word line sector, either the erasure is performed for all memory cells in the memory array at one time and the level data of the data rewrite is designated for each word line sector or the erasure is also performed for each word line sector and the level data of the data rewrite is designated for each word line sector.

Figure 13:
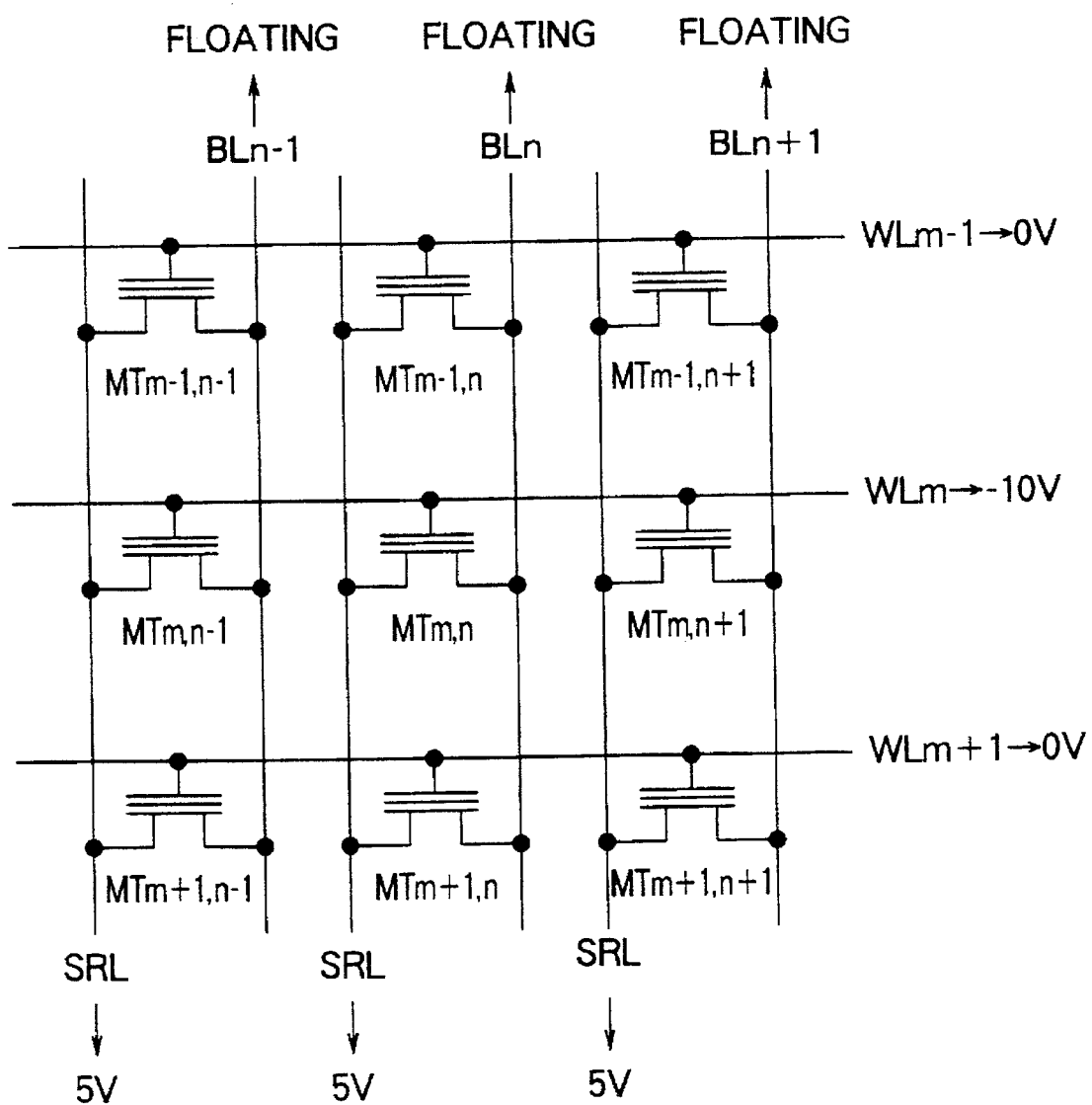
FIG. 13 is a diagram which shows the bias conditions at a erase operation of a word line sector of the NOR type flash memory.

FIG. 13 is a diagram which shows the bias conditions in the case where the memory array is divided into word line sectors and the erase operation is performed for each word line sector.

In this case, as shown FIG. 13, −10 V is supplied to the selected word line, WLm, 0 V is supplied to the unselected word lines WLn−1, and WLn+1, all of the bit lines BLn−1, BLn, and BLn+1 are biased to a floating condition, and 5 V is supplied to the common source line SRL.

As a result, only the memory cell which is connected to the selected word line WLm will have electrons extracted from the source side by FN tunneling and the threshold voltage Vth will be about 1 to 2 V.

Figure 14:
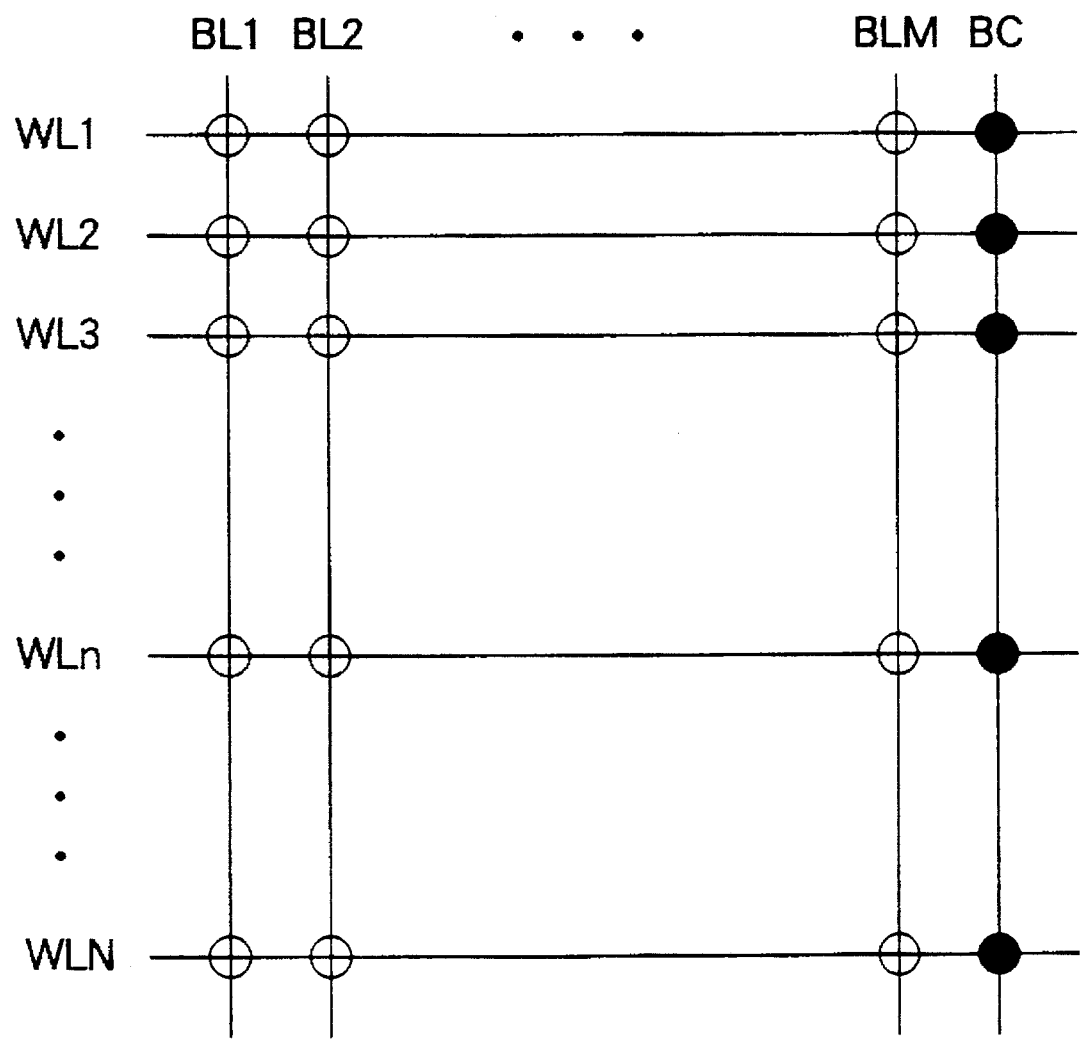
FIG. 14 shows an example of a case in which a level data recorder provided for each word line sector in the flash memory array is located in a memory cell which is connected to an auxiliary bit line provided in the memory array.

FIG. 14 is a diagram which shows the case where a level data recorder is provided for each word line sector in the flash memory array in a memory cell which is connected to the auxiliary bit line in the memory array.

As shown in FIG. 14, WL1 to WLN show word lines, BL1 to BLM show normal bit lines, and BC shows the auxiliary bit line for the level data recorder which is located outside the normal bit lines.

In FIG. 14, the small white circles show the memory cells which are used as the normal memory cells, while the black circles show the memory cells which are used as the level data recorders.

FIG. 14 is a diagram which shows the case where a level data recorder is provided for each word line sector of memory array area, but this invention includes other modes as well.

When rewriting data by designating the level data at rewrite for each block of a memory array area divided into blocks, either the erasure is performed for all memory cells in the memory array at one time and the level data of the data rewrite is designated for each block or the erasure is also performed for each block and the level data of the data rewrite is designated for each block.

Figure 15:
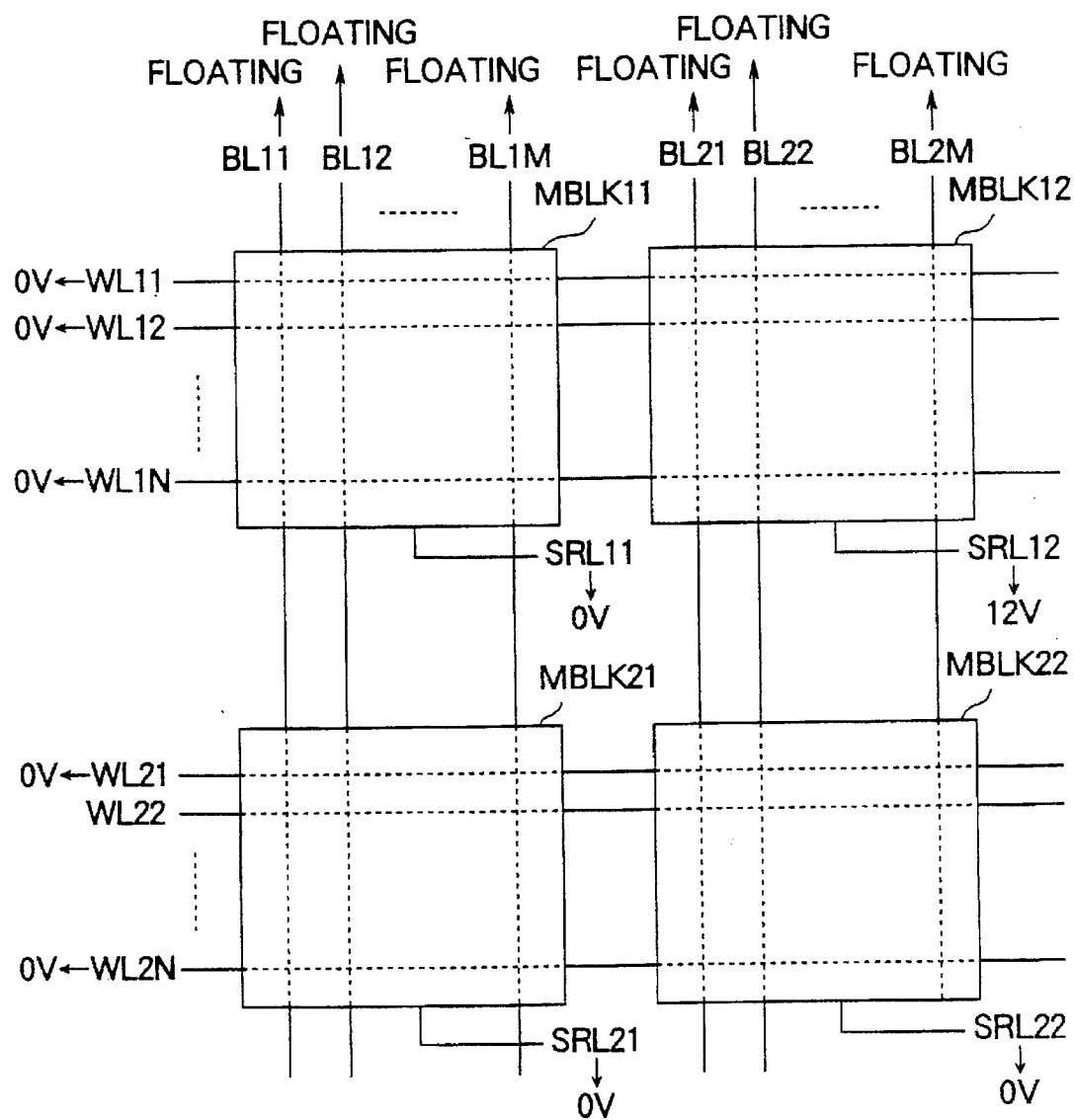
FIG. 15 is a diagram which shows the bias conditions at an erase operation of a block in the case where the memory array is divided into a plurality of the blocks.

FIG. 15 is the diagram which shows the bias conditions at an erase operation of a block of a memory array area divided into a plurality of blocks.

In FIG. 15, the memory array is divided into the four blocks MBLK11, MBLK12, MBLK21, and MBLK22. In FIG. 15, WL11 to WL1N and WL21 to WL2N show word lines, BL11 to BL1M and BL21 to BL2M show bit lines, and SRL11, SRL12, SRL21, and SRL22 show common source lines of each block.

The erase operation shown in FIG. 15 is the case of the erase operation of the memory block MBLK12. All of the word lines WL11 to WL1N are biased to 0 V, all of the bit lines BL11 to BL1M and BL21 to BL2M are biased to a floating condition, 12 V is supplied to the common source line SRL12 of the selected memory block MBLK12, and 0 V is supplied no the common source lines SRL11, SRL21, and SRL22 of the other memory blocks MLK11, MBLK21, and MBLK22.

AS a result, only the memory cells in the selected memory block 12 will have electrons in the floating gate extracted from the source side by the FN tunneling, and the threshold voltage Vth of the memory cells will be about 1 to 2 V.

Figure 16:
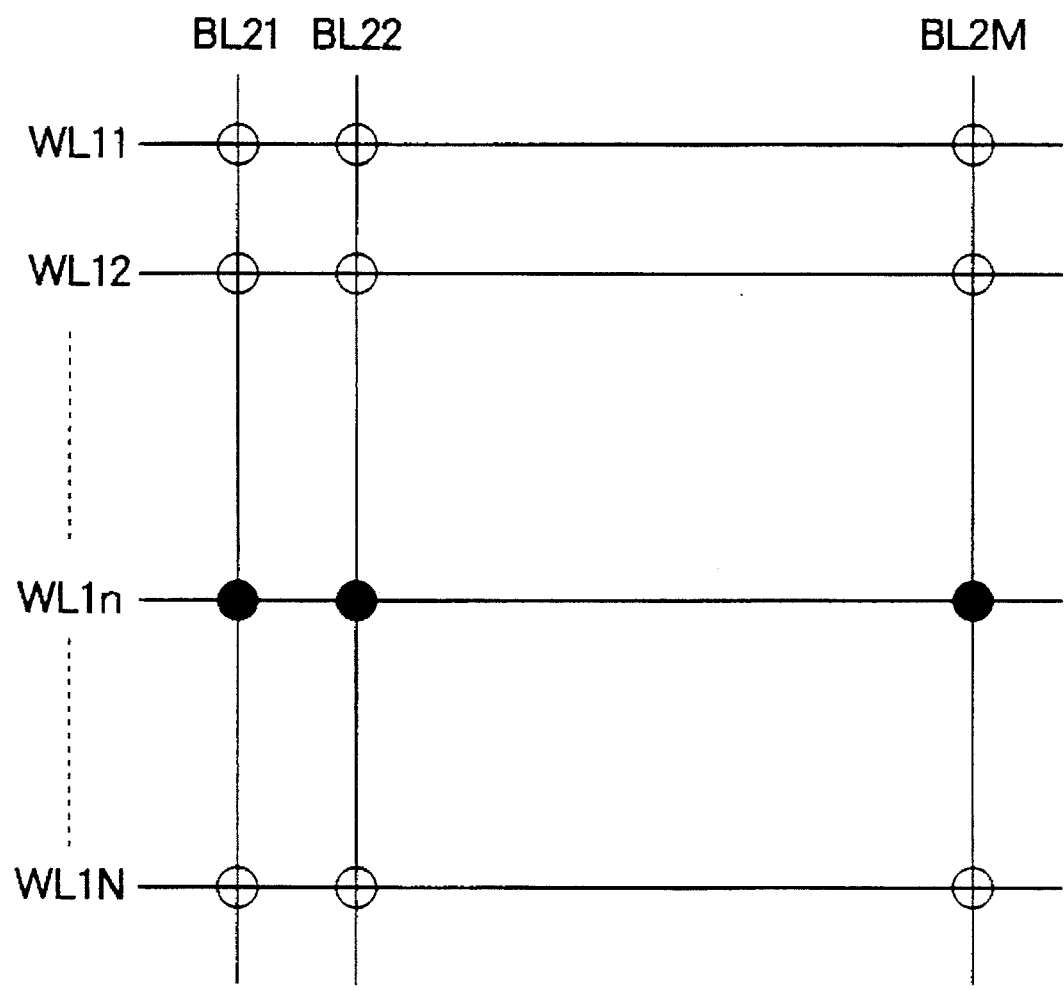
FIG. 16 is a diagram which shows an example of the case in which the level data recorder is located at a memory block of a memory array area divided into blocks.

FIG. 16 is a diagram of the case where a level data recorder is located in part of a memory block MBLK12 of a memory array area divided into blocks show in FIG. 15.

In FIG. 16, the level data recorder provided in the memory block MBLK12 are connected to one normal word line in the memory block array.

In FIG.16, WL11 to WL1N show normal word lines, BL21 to BL2M show normal bit lines, and WL1n shows the one word line for the level data recorder which is located in normal word lines.

In FIG. 16, the small white circles shows the memory cells which are used as the normal memory cells, while the black circles show the memory cells which are used as the level data recorder. It is enough that there be will only one memory cell which is used as the level data recorder. The information of the file name, the date, and the time of rewrite etc. can be written in the other memory cells.

FIG. 16 is a diagram of the case where the level data recorder is located in a memory cell which is connected to a normal word line in the memory block array area, but this invention is not limited to this and includes other modifications.

As explained above, in the repeatedly rewritable nonvolatile semiconductor memory device, especially, a CHE writing/FN erasing NOR type flash memory, even if there are over-erased cells, after the rewrite operation, all of the over-erased memory cells will be in the written condition, that is, the threshold voltage Vth of the memory cells will be more than 5 V, so the over-erased cells will not become a disadvantage.

What is claimed is:

1. A semiconductor nonvolatile memory device having a plurality of individual erasable and rewritable memory cells, the individual memory cells having one of an erased state or an over-erased state consequent to an erase operation or a written state consequent to a write or rewrite operation, the semiconductor nonvolatile memory device comprising:

a write circuit for writing data into the memory cells;

a detecting circuit for detecting and identifying any memory cells in the over-erased state, said write circuit writing, into any memory cell where over-erasure had been detected, data of a normal level or an inverted level based on the data which should be written in the over-erased cells, and a recorder for recording if said write circuit wrote the data the same or inverted in level in the over-erased memory cell.

2. A semiconductor nonvolatile memory device as set forth in claim 1, wherein each memory cell comprises a floating gate transistor in which written state data is written by increasing the threshold voltage thereof to a selected level, said write circuit comprising means for increasing the threshold voltage of a memory cell to said selected level, wherein the write circuit writes data maintaining the same level at the time of the write operation when the data which should be written in the memory cells are all written state data and writes data inverted in level at the time of the write operation when the data which should be written in the memory cells are all erased state data and at least one of the memory cells to which data is to be written is an over-erased memory cell.

3. A semiconductor nonvolatile memory device as set forth in claim 1, said memory cell comprising a control gate, a floating gate, a source, a drain, and a channel between said source and said drain, and further comprising a read circuit supplying said control gate of said memory cell which controls said floating gate with a voltage which is lower than a voltage applied to said source and said drain of the memory cell.

4. A semiconductor nonvolatile memory device as set forth in claim 1, wherein said write circuit effects an erase operation again when there is at least one over-erased cell within a group of cells to which data is to be written and the data to be written to said group of cells are different.

5. A semiconductor nonvolatile memory device as set forth in claim 1, further comprising a determination circuit for reading data from a memory cell of a designated address, reading the level data at the time of the write operation to the memory cell recorded in the level recorder, and determining the read data based on that level data, and the read circuit maintaining or inverting the level of the read data on the basis of the determination of the determination circuit.

6. A semiconductor nonvolatile memory device as set forth in claim 1, wherein said level recorder is provided inside a portion of a memory array area.

7. A semiconductor nonvolatile memory device as set forth in claim 1, wherein said memory is divided into word line sectors and a level recorder is provided for each word line sector and writing is performed designating the level at the time of writing the data for each word line sector.

8. A semiconductor nonvolatile memory device as set forth in claim 7, wherein the level recorder comprises at least one auxiliary memory cell connected to at least one auxiliary bit line.

9. A semiconductor nonvolatile memory device as set forth in claim 1, wherein a memory array area is divided into blocks and the level recorder is provided for each block and writing is performed designating the level at the time of writing the data for each block.

10. A semiconductor nonvolatile memory device as set forth in claim 9, wherein said level recorder is provided at a location in which an auxiliary word line and bit line intersect.

* * * * *